United States Patent [19]
Khandavalli

[11] Patent Number: 5,132,641
[45] Date of Patent: Jul. 21, 1992

[54] APPARATUS AND METHOD FOR DIVIDING/COMBINING MICROWAVE POWER FROM AN ODD NUMBER OF TRANSISTOR CHIPS

[75] Inventor: Chandra Khandavalli, Fremont, Calif.
[73] Assignee: Fujitsu Limited, Kawasaki, Japan
[21] Appl. No.: 694,127
[22] Filed: May 1, 1991
[51] Int. Cl.$^5$ .............................................. H03F 3/68
[52] U.S. Cl. ................................ 330/295; 330/277; 333/128
[58] Field of Search ........................... H01P/5/12

[56] References Cited

U.S. PATENT DOCUMENTS

| | | | |
|---|---|---|---|
| 4,631,492 | 12/1986 | Magarshack et al. | 330/277 |
| 4,835,496 | 5/1989 | Schellenberg et al. | 333/128 |
| 4,975,659 | 12/1990 | Butler et al. | 330/277 X |

*Primary Examiner*—Paul Gensler
*Attorney, Agent, or Firm*—Christie, Parker & Hale

[57] ABSTRACT

A power divider/combiner circuit is disclosed for connecting to a single port, 2N+1 multi-cell monolithic transistor chips, each chip composed of an even number of cells. A planar binary tree type transmission line structure is provided having first and second ends for connecting $2^P$ transmission line ports at the first end to the single port at the second end, where N and P are each integers greater than or equal to 1, and an equal number of cells are connected to each of the $2^P$ transmission line ports The value of P is chosen such that $$\frac{C}{2^P} = R$$

where R is an integer greater than 1, and C is the sum total of the number of cells in the 2N+1 chips. R cells are connected to each of the $2^P$ transmission line ports, and some cells from at least one transistor chip are connected to a transmission line port which is different from the port to which other cells from that one chip are connected.

28 Claims, 6 Drawing Sheets

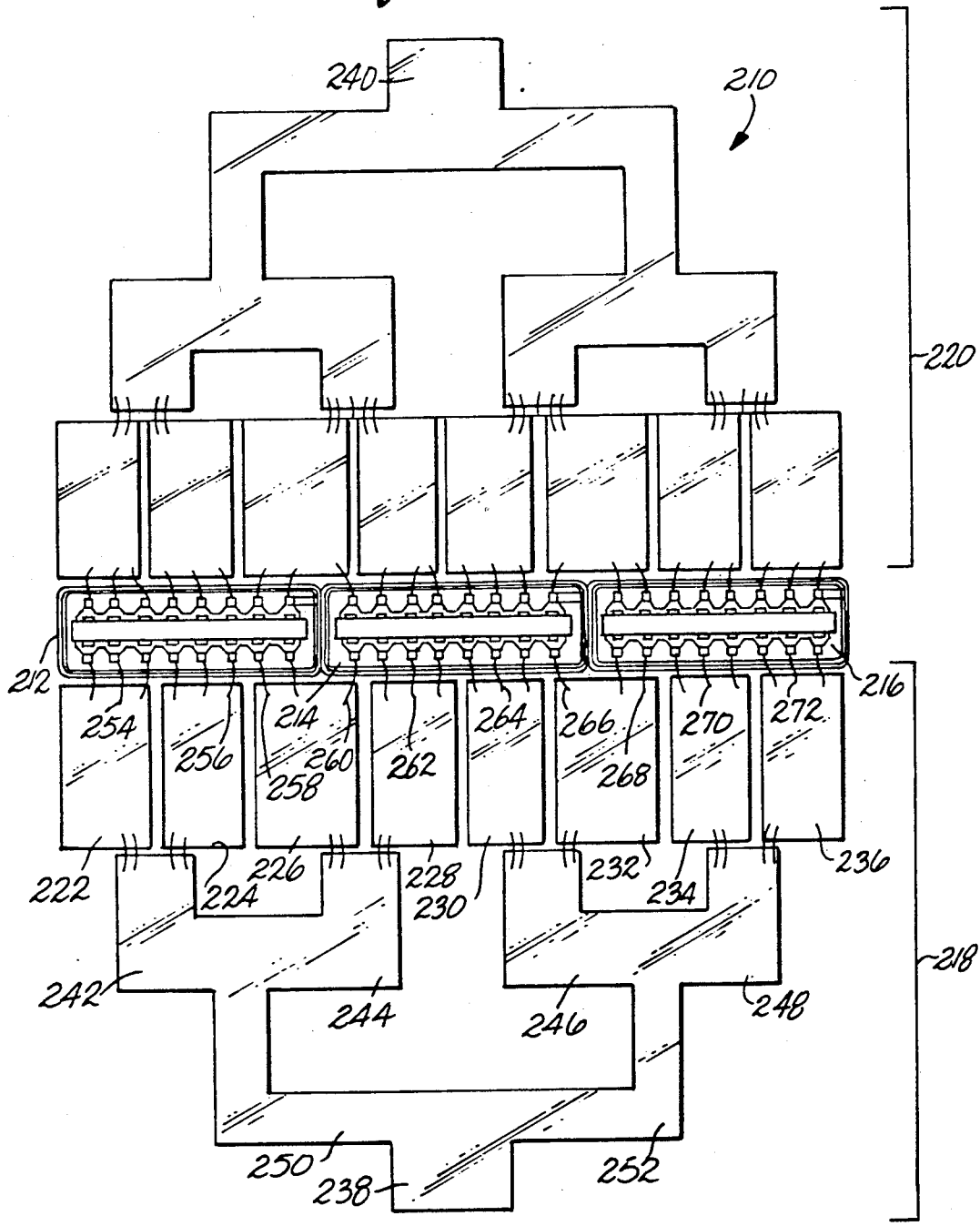

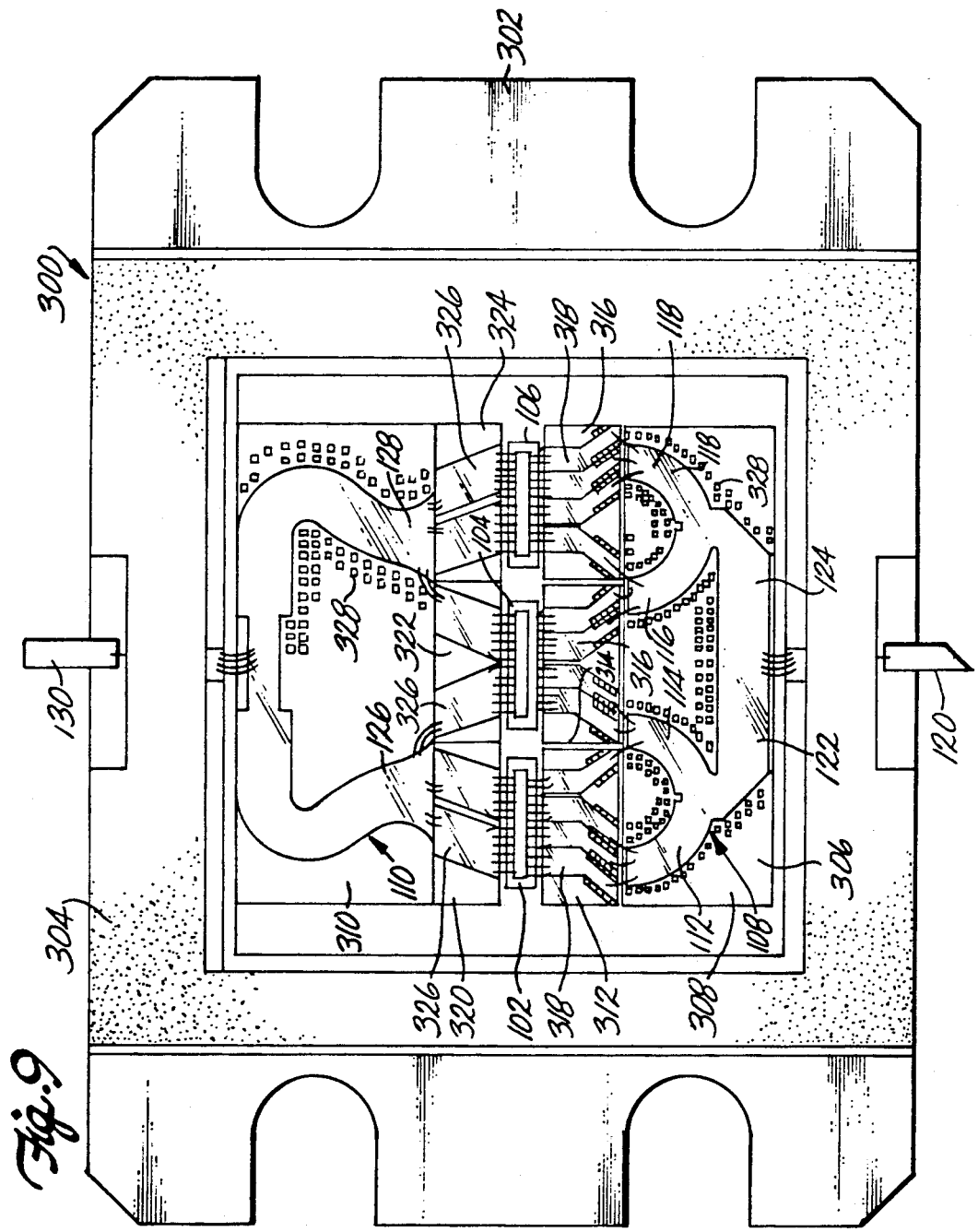

APPARATUS AND METHOD FOR DIVIDING/COMBINING MICROWAVE POWER FROM AN ODD NUMBER OF TRANSISTOR CHIPS

FIELD OF THE INVENTION

This invention relates to microwave divider/combiner circuits and, more particularly, to planar divider/combiner circuits for use with an odd number of multiple transistor chips.

BACKGROUND OF THE INVENTION

A number of power divider/combiner configurations have been developed to divide a microwave input signal into a number of signals to feed multiple solid state devices such as power transistors, and to combine the output signals from these devices into a single signal. The term microwave as used herein is intended to include both microwave and millimeter wave signals.

Several different geometries have evolved to accomplish these divider/combiner functions, including circular, radial and planar configurations. Examples of these configurations are disclosed in E. J. Wilkinson, "An N-way Hybrid Power Divider," IRE Trans. on Microwave Theory and Tech., vol. MTT-8, pp. 116–118, Jan. 1960; in U.S. Pat. No. 4,234,854, entitled "Amplifier With Radial Line Divider/Combiner", issued Nov. 18, 1980, to Schellenberg et al.; N. Nagai, E. Maekawa and K. Ono, "New N-Way Hybrid Power Dividers," IEEE Trans. on Microwave Theory and Tech., vol. MTT-25, pp. 1008–1012, Dec. 1977; and U.S. Pat. No. 4,835,496, entitled "Power Divider/Combiner Circuit", issued May 30, 1989, to Schellenberg et al.

One particular application for a microwave divider-combiner is to connect together multiple power transistor chips to form a high power amplifier. These chips may take the form of GaAs Metal Field Effect transistors (MESFETSs) or bipolar transistors. Power amplifiers of this type may be packaged as hybrid circuits in metal-ceramic hermetically sealed packages. Such elements, particularly the transmission lines, also referred to as matching networks, which act as signal paths between the multiple chips and the single input-output ports. A requirement for these transmission lines is that they provide equi-distant and symmetric signal path lengths between the transistor chip terminals and the input/output ports in order to provide equiphase combining-dividing functions. Further, it is desirable to maintain the width of the various signal paths at less than half a wavelength in order to minimize parasitic resonances.

In order to minimize the package size and amplifier power requirements, it is desirable to use the minimum number of transistor chips needed to provide the desired output power level. Often, this will result in the need to use an odd number of multiple transistor chips.

Accordingly, it is an object of the invention to provide a compact divider/combiner circuit which meets the above criteria and is suitable for use in providing the desired signal paths from an odd number of multiple transistor chips housed in a hybrid circuit package.

SUMMARY OF THE INVENTION

The foregoing and other objects of the invention are accomplished by providing a power divider/combiner circuit for connecting to a single port, $2N+1$ multi-cell monolithic transistor chips, where each chip is composed of an even number of cells. A planar binary tree type transmission line structure is provided having first and second ends for connecting $2^P$ transmission line ports at the first end to the single port at the second end, where N and P are each integers greater than or equal to 1, and an equal number of cells are connected to each of the $2^P$ transmission line ports.

$$\frac{C}{2^P} = R$$

where R is an integer greater than 1, and C is the sum total of the number of cells in the $2N+1$ chips. R cells are connected to each of the $2^P$ transmission line ports, and some cells from at least one transistor chip are connected to a transmission line port which is different from the port to which other cells from that one chip are connected.

In one embodiment, each of the $2N+1$ transistor chips are Field Effect transistors (FETs), and each of the chip cells includes a signal input (gate) and output (drain) terminal. A power divider/combiner circuit is provided for connecting the input and output terminals to single input and output ports, respectively. A first planar binary tree type transmission line structure is provided having first and second ends for connecting $2^P$ transmission line ports at its first end to the single input port at its second end.

A second planar binary tree type transmission line structure is also provided having first and second ends for connecting $2^S$ transmission line ports at its first end to the single output port at its second end, where N, P and S are each integers greater than or equal to 1. An equal number of input terminals are connected to each of the $2^P$ transmission line ports, and an equal number of output terminals are connected to each of the $2^S$ transmission line ports.

The value of P is chosen as above and the value of S is chosen such that $$\frac{C}{2^S} = T$$

where T is an integer greater than 1, and T output terminals are connected to each of the $2^S$ transmission line ports.

Some input terminals from at least one transistor chip are connected to an input transmission line port which is different from the port to which other input terminals from that one chip are connected, and some output terminals from at least one transistor chip are connected to an output transmission line port which is different from the port to which other output terminals from that one chip are connected.

A method is also disclosed for connecting to a single port, $2N+1$ multi-cell monolithic transistor chips, each chip composed of an even number of cells. The method includes the steps of:

providing a planar binary tree type transmission line structure having first and second ends for connecting $2^P$ transmission line ports at the first end to the single port at the second end, where N and P are each integers greater than or equal to 1; and connecting an equal number of cells to each of the $2^P$ transmission line ports.

The method further includes the step of selecting P such that $$\frac{C}{2^P} = R$$

where R is an integer greater than 1, C is the sum total of the number of cells in the 2N+1 chips, and the step of connecting an equal number of cells includes connecting R cells to each of the $2^P$ transmission line ports, and further includes connecting some cells from at least one transistor chip to a transmission line port which is different from the port to which other cells from that one chip are connected.

BRIEF DESCRIPTION OF THE DRAWINGS

FIG. 8 is a top view illustrating yet another configuration of the invention in which three 8-cell transistor chips are connected to a single input port using an 8-port input transmission line and to a single output port using an 8-port output transmission line in accordance with the teachings of the invention; and FIG. 9 is a top view showing the configuration of FIG. 6 adapted for installation in a metal-ceramic hermetically sealed hybrid circuit package and illustrating the use of multiple bonding pads to facilitate the connections between the chips and the transmission lines.

DISCUSSION OF THE PRIOR ART

Figure 1:
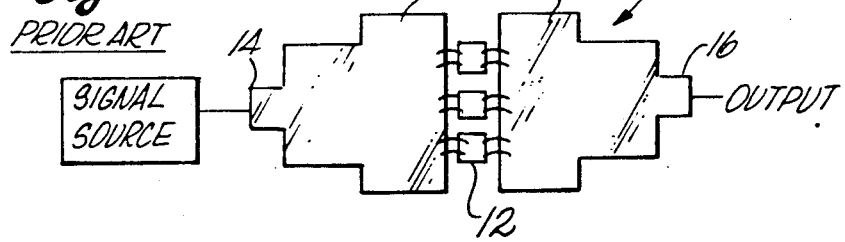
FIG. 1 is a top view of a prior art circuit showing three FET chips connected to single input and output ports using single-element input and output transmission networks, respectively.

FIG. 1 is a top view of a prior art circuit 10 showing three FET chips 12 connected to single input and output ports 14,16 using single-element input and output transmission networks 18,20, respectively. As stated above, it is desirable to limit the width of transmission line elements to less than one half wavelength. In the circuit 10, it is difficult to meet this constraint where a substantial number of large chips are to be connected to single ports. Thus, the circuit 10 is limited in use to a small number of small geometry chips which can be clustered in a region whose extent is small compared with a wavelength.

Figure 2:
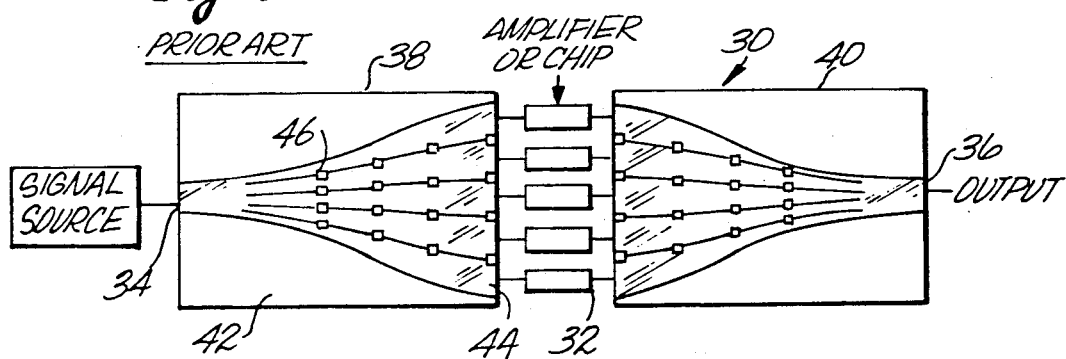
FIG. 2 is a top view of a prior art circuit showing five amplifiers or chips connected to single input and output ports using multi-port tapered strip type power dividers/combiners of the type described in U.S. Pat. No. 4,835,496.

FIG. 2 is a top view of another prior art circuit 30 showing five amplifiers or chips 32 connected to single input and output ports 34,36 using multi-port tapered strip type power dividers/combiners 38,40 of the type described in U.S. Pat. No. 4,835,496. The input divider 38 includes a ceramic substrate 42 having metallized thereon five tapered transmission line strips 44 which provide connections between the chips 32 and the input port 34. The taper is preferably a Dolph-Tchebycheff taper, and resistors 46 connect adjacent strips at quarter wavelength positions along the length of the line. The output combiner 40 is substantially identical in construction.

From the diagram, it is apparent that this type of circuit requires transmission lines which are quite long, extending one or more wavelengths. It may be shown that a circuit of this type using short line lengths results in substantially unequal path lengths from the various chips to the input/output ports. These unequal lengths in turn produce phase shift errors. Further, as shown below, circuits using long transmission lines are unsuitable for use with hybrid circuit packaging techniques, as they would result in a substantial amount of wasted space.

Figure 3:
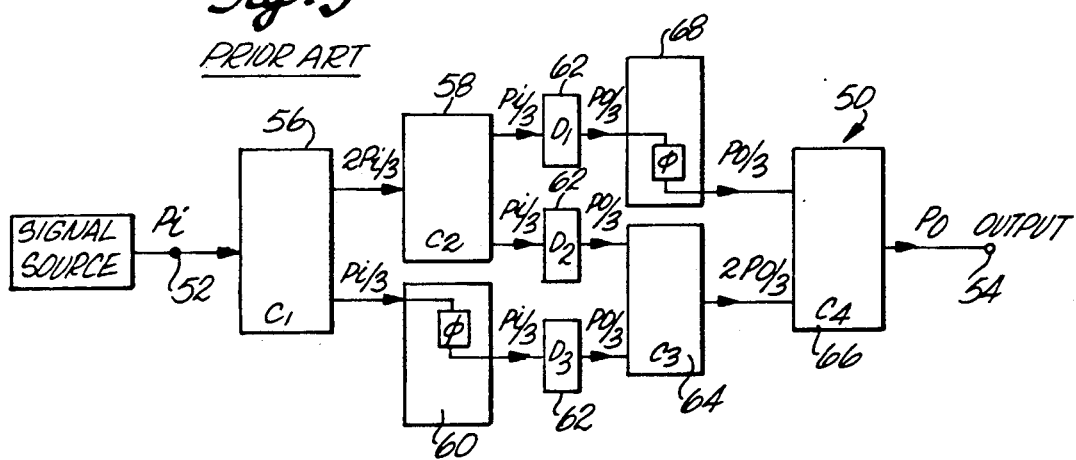
FIG. 3 is a prior art circuit showing three amplifiers or devices connected to single input and output ports using a variety of combiner/divider circuits in conjunction with phase corrector circuits.

FIG. 3 shows yet another prior art circuit 50 in which three amplifiers or devices are connected to single input and output ports 52,54 using a variety of combiner/divider circuits in conjunction with phase corrector circuits. In particular, the circuit 50 uses dividers 56 which provides unequal power output signals, divider 58 which provides equal power output signals, and phase corrector 60 to provide equal power/phase signals to three transistor chips 62. Output signals from the chips 62 are coupled to the output port 54 using equal power combiner 64, unequal power combiner 66, and phase corrector 68.

The circuit 50 is difficult and costly to construct due to the many components required, and its electrical performance is degraded due to the losses in the various elements. This type of circuit also does not lend itself well for use in conjunction with current standard hybrid circuit packages.

DETAILED DESCRIPTION OF THE PREFERRED EMBODIMENTS

Figure 4:
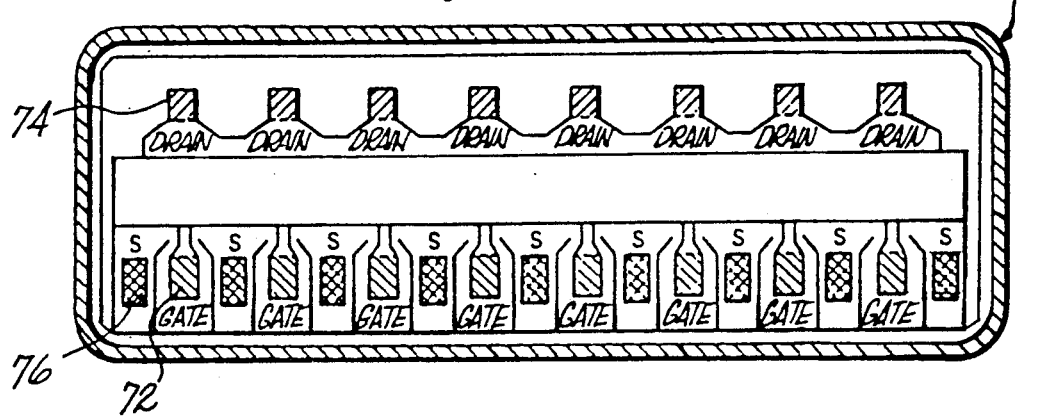
FIG. 4 is a top view of a typical GaAs MESFET transistor chip showing the multiple cells contained therein.

FIG. 4 is a top view of a GaAs MESFET transistor chip 70 of the type for use in the present invention. The particular device shown is similar to type FLK 202XV, manufactured by Fujitsu Limited, Japan. This chip is designed to provide output power levels of about 32.5 dBm at a frequency of 14.5 GHz, and has an operating frequency range extending over the X and Ku bands. The chip size is approximately 50 mils in length and 16 mils in width, and is made up of eight cells.

A cell is, defined as that portion of a chip corresponding to a single pair of opposing input (gate) and output (drain) terminals. For ex-ample, in FIG. 4, gate terminal 72 in conjunction with opposing drain terminal 74 form a cell. In like manner, the remaining opposing pairs of gate/drain terminals form the other seven cells of the chip 70. The gate and drain terminals are in the form of bonding pads for accepting wire such as 1 mil diameter gold wire, which is attached to the pads using well known techniques including thermocompression bonding. This type of multi-cell construction is used in high frequency chips to enable, the uses of multiple semiconductor junctions whose size is small compared to the signal wavelength. The number of cells per chip is almost always an even number. There is also a source terminal associated with each cell, such as the source terminal 76 associated with the terminals 72 and 74. In some chips such as the one shown, there is a direct connection between each source terminal and the bottom surface of the chip. These connections are made using via holes which extend vertically through the chip and provide a common source-substrate connection.

Figure 5:
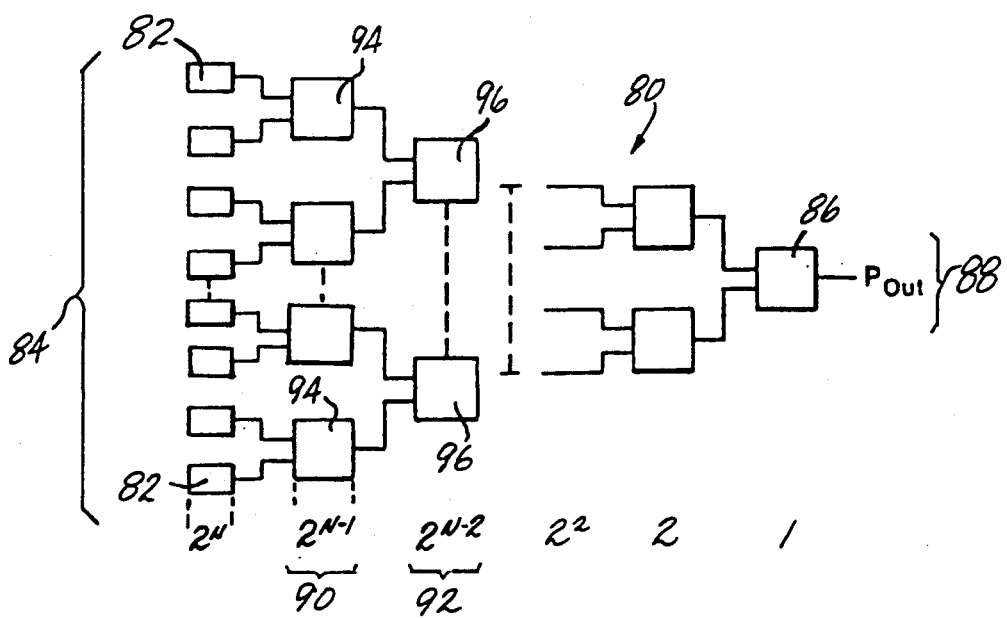
FIG. 5 is a block diagram showing a generalized planar binary tree type transmission line structure.

FIG. 5 is a block diagram showing a generalized planar binary tree type transmission line structure 80. The structure 80 is characterized by a binary tree of elements which connect $2^N$ ports 82 at a first end 84 to a single port 86 at a second end 88, where N is an integer equal to or greater than 1. It may be seen that the elements between the first and second ends 84,88 in the tree 80 are arranged in stages (eg. 90,92) where the number of elements (eg. 94,96) in each is in the ratio of decreasing powers of 2. Each element acts to combine two elements from the previous stage.

The binary tree 80 has been used in divider/combiner circuits where an even number of chips or devices are connected to a single port, but it has not found application to the connection of an odd number of chips due to the mismatch between such odd number of chips and the even number of ports 82. Advantages of the binary tree include a compact physical structure whose width and length can be tailored to meet a variety of physical configurations, and the ability to realize the configuration in planar structures. It is an object of the present invention to adapt the binary tree configuration 80 for use with an odd number of multiple transistor chips where each chip contains an even number of cells.

Figure 6:
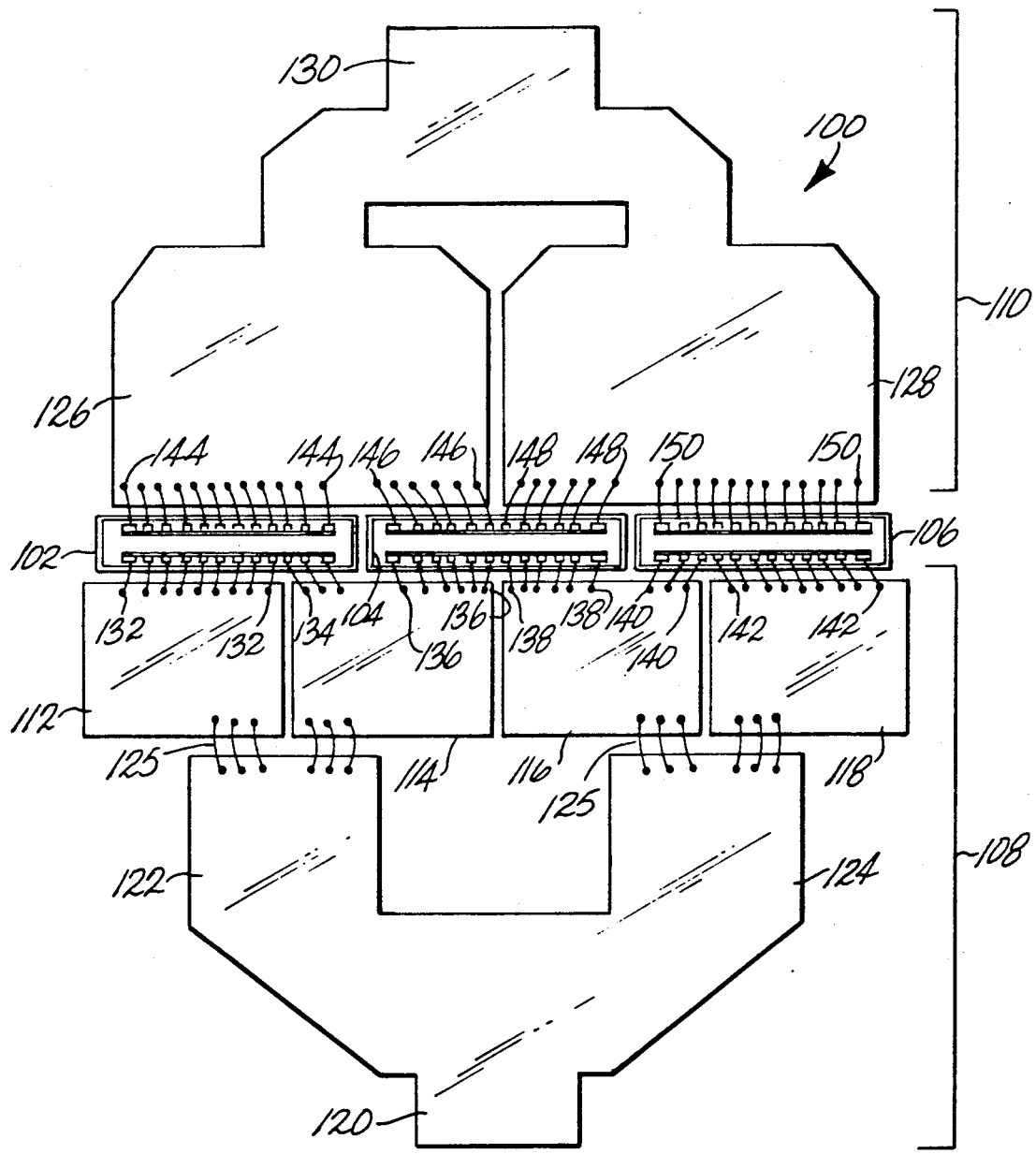
FIG. 6 is a top view illustrating one configuration of the invention in which three 12-cell transistor chips are connected to a single input port using a 4-port input transmission line and to a single output port using a 2-port output transmission line in accordance with the teachings of the invention.

FIG. 6 is a top view illustrating one configuration 100 of the invention in which three 12-cell transistor chips are connected to a single input port using a 4-port input binary tree transmission line and to a single output port using L 2-port binary tree output transmission line in accordance with the teachings of the invention. Three 12-cell transistor chips 102,104, and 106 are mounted side by side on a suitable substrate, which may be metal such as plated copper, or metallized ceramic such as alumina or beryllia. These chips are similar in construction to the 8-cell chip shown in FIG. 4, except that they each contain 12 cells. An example of a 12-cell chip is Fujitsu type FL605, having a length of about 104 mils and a width of about 24 mils. Each chip is capable of delivering about 6 watts of RF power.

An input binary tree transmission line 108 is positioned adjacent the gate terminal side of the chips, and an output binary tree transmission line 110 is positioned adjacent the drain terminal side of the chips. These transmission lines may be constructed using a metallized ceramic substrate, where the metallization pattern forms the line elements. It may be seen from the figure that the input line 108 contains 4 ports 112–118 at its first end and a single input port 120 at its second end. The ends are connected by the two elements 122,124 and suitable wirebond 125 in the binary fashion shown in FIG. 5. In similar fashion, the output line 110 contains 2 ports 126,128 at its first end which are connected to a single output port 130 at its second end.

As stated above the present invention is directed to configurations employing an odd number of multiple chips (ie. 2N+1 chips, where N is an integer greater than or equal to 1)), each having an even number of cells. For a given application, the actual number of ports (designated $2^P$, where P is an integer greater than or equal to 1) which may be used at the first end of aa transmission line used in conjunction with those 2N+1 chips are determined by those values of P which satisfy the following equation:

$$\frac{C}{2^P} = R \qquad (1)$$

where R is an integer greater than 1, and C is the sum total of the number of cells contained in the 2N+1 chips. C is computed by summing the number of cells in each chip, such sum being an even number.

Applying this criterion to the configuration of FIG. 6, the value of C is 36 (12 cells per chip × 3 chips), and values of P which satisfy equation 1 are:

| P = 1 | (R = 18) |
|---|---|
| P = 2 | (R = 9) |

The values of P satisfying equation 1 yield values of transmission line ports which enable an equal division of the total number of cells C, whereby an equal number of R cells can be connected to each of these ports. This type of configuration provides signal path lengths from each of the cells which are substantially equal in length and symmetrical in physical characteristics.

For example, P=1 represents a 2-port transmission line, where each port can be connected to 18 cells; and P=2 represents a 4-port line, where each port can be connected to 9 cells Further, some cells from at least one transistor chip are connected to a transmission line port which is different from the port to which other cells from that chip are connected.

Applying these principals to the configuration in FIG. 6, nine gate (input) terminals 132 (reference designators point to the wirebonds corresponding to these terminals for clarity from chip 102 are connected (using wire bonds) to the port 112 of the 4-port input line 108: three gate terminals 134 from the chip 102 along with 6 gate terminals 136 from the chip 104 (for a total of nine terminals from nine cells) are connected to the port 114; six gate terminals from the chip 104 along with three gate terminals 140 from this chip 106 are connected to the port 116; and nine gate terminals 142 from the chip 106 are connected to the port 118. Thus each of the 4 ports of the line 108 are connected to 9 cells.

In like manner, all twelve drain (output) terminals 144 from the chip 102 are connected along with 6 drain terminals 146 from the chip 104 (for a total of 18 terminals from 18 cells) to the port 126 of the 2-port input line 110; and six drain terminals 148 from the chip 104 are connected along with the twelve drain terminals 150 from the chip 106 are connected to the port 128. Thus, each of the 2 ports of the line 110 are connected to 18 cells.

Note that the choice of whether to use a 2-port or 4-port line on the input or output side of the configuration 100 is a design choice which depends on the particular characteristics desired. Generally, a higher value of P enables the use of narrower widths (e.g. widths less than half a wavelength) for the ports. Thus, the configuration 100 could be changed so that the input and output lines were both 4-port or were both 2-port designs, or the 2 and 4 port lines shown could be reversed as to input and output. From the above description, it may be seen that the present invention accomplishes the objective of connecting an odd number of chips to a binary tree in a manner which provides power divider/combiner functions in a symmetrical configuration which maintains equal phase and amplitude between the signal paths.

Figure 7:
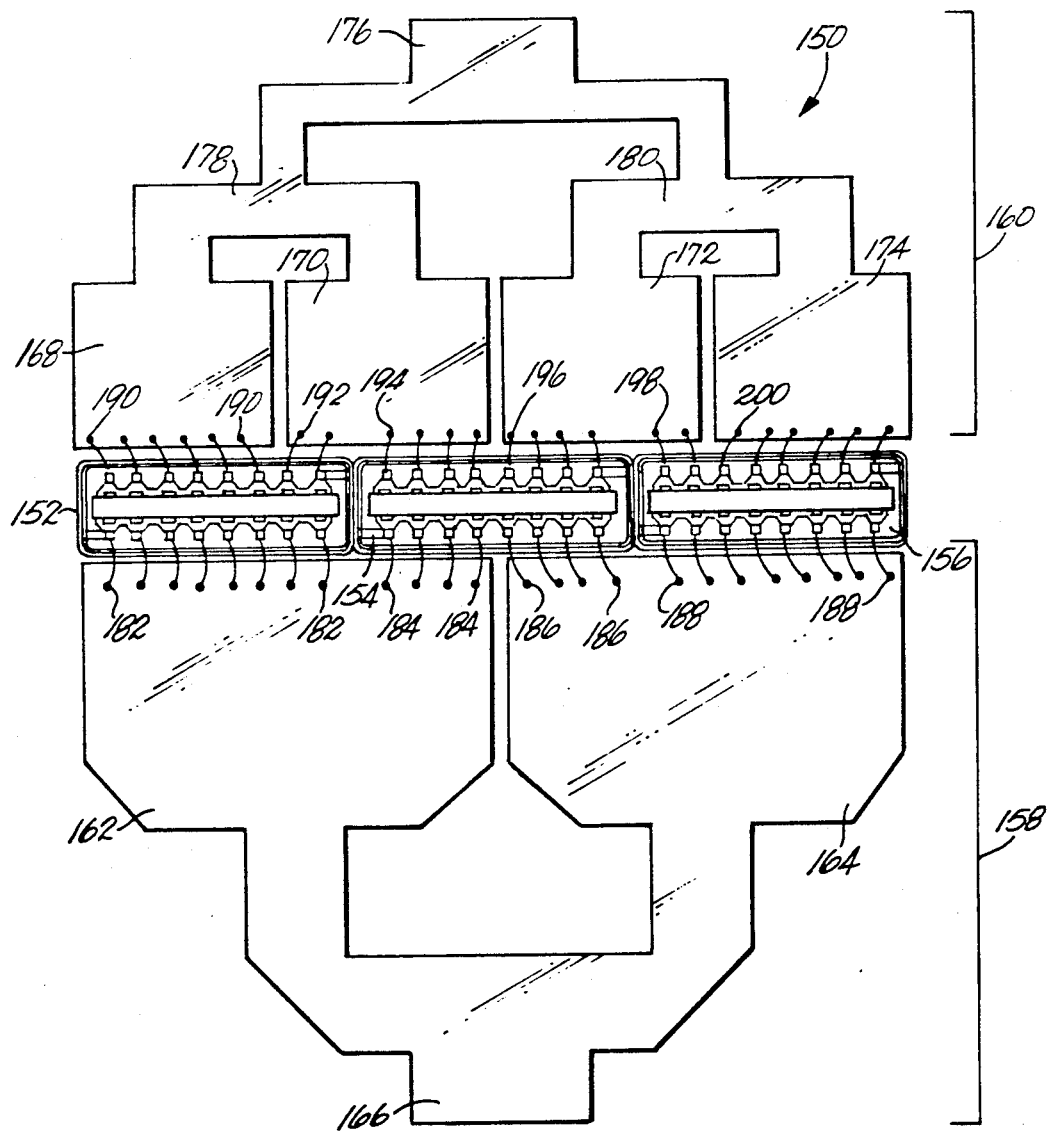
FIG. 7 is a top view illustrating another configuration of the invention in which three 8-cell transistor chips are connected to a single input port using a 2-port input transmission line and to a single output port using a 4-port output transmission line in accordance with the teachings of the invention.

FIG. 7 is top view illustrating another configuration employing the invention, in which three 8-cell transistor chips are connected to a single input port using a 2-port input transmission line and to a single output port using a 4-port output transmission line in accordance with the teachings of the invention. Three 8-cell transistor chips 152,154, and 156 are mounted as in the previous configuration 100. These chips may be the same as those shown in FIG. 4.

An input binary tree transmission line 158 is positioned adjacent the gate terminal side of the chips, and an output binary tree transmission line 160 is positioned adjacent the drain terminal side of the chips. These transmission lines may be constructed in the same manner as described above.

To determine the number of ports ($2^P$) which may be employed in transmission lines for this configuration 150, equation 1 will again be used. In this instance, C is equal to 24 (8 cells per chip times 3 chips), and the equation yields the following values for P and R:

| P = 1 | (R = 12) | 2-port line, 12 cells/port |
|---|---|---|
| P = 2 | (R = 6) | 4-port line, 6 cells/port |
| P = 3 | (R = 3) | 8-port line, 3 cells/port |

The values of P satisfying equation 1 again yield values of transmission line ports which enable an equal division of the total number of cells C, whereby an equal number of R cells can be connected to each of these ports.

In the configuration 150, 2-port and 4-port lines (P = 1 and P = 2) are shown for input and output lines 158,160, respectively. The input line 158 contains 2 ports 162,164 at its first end connected to a single input port 166 at its second end. In similar fashion, the output line 160 contains 4 ports 168-174 at its first end which are connected to a single output port 176 at its second end. The ends are connected by the two elements 78,180 in the binary fashion shown in FIG. 5.

Eight gate (input) terminals 182 from chip 152 are connected (using wire bonds) to the port 162 of the 2-port input line 158 along with four gate terminals 184 from the chip 154 (for a total of 12 terminals from 12 cells); and four gate terminals 186 from the chip 154 are connected to the port 164 along with the eight gate terminals 188 from the chip 156 (for a total of 12 terminals from 12 cells). Thus each of the 2 ports of the line 158 are connected to 12 cells.

In like manner, six drain (output) terminals 190 from the chip 152 are connected to the port 168 of the 4-port output line 160; two drain terminals 192 from the chip 152 are connected along with four drain terminals 194 from the chip 154 to the port 170; four drain terminals 196 from the chip 154 along with two drain terminals 198 from the chip 156 are connected to the port 172; and six drain terminals 200 from the chip 156 are connected to the port 174. Thus, each of the 4 ports of the line 160 are connected to 6 cells.

FIG. 8 is a top view illustrating yet another configuration 210 of the invention in which the three 8-cell transistor chips are connected to single input and output ports port using 8-port transmission lines (P = 3). Three 8-cell transistor chips 212,214, and 216 are mounted as in the previous configuration 150. These chips may be the same as these shown in FIG. 4.

An input binary tree transmission line 218 is positioned adjacent the gate terminal side of the chips, and an output binary tree transmission line 220 is positioned adjacent the drain terminal side of the chips. These transmission lides may be constructed in the same manner as described above.

In the configuration 210, 8-port lines (P = 3) are shown for input and output lines 218,220, respectively. The input line 218 contains 8 ports 222-236 at its first end connected to a single input port 238 at its second end. In similar fashion, the output line 220 contains 8 ports at its first end which are connected to a single output port 240 at its second end. The ends are connected by, for example, the four elements 242-248, and the two elements 250,252 in the binary fashion shown in FIG. 5.

Three gate (input) terminals 254 from chip 212 are connected (using wire bonds) to the port 222 of the 8-port input line 218; three gate terminals 256 from chip 212 are connected to port 224; two gate terminals 258 from chip 212 along with a single gate terminal 260 from the chip 214 are connected to port 226; three gate terminals 262 from the chip 214 are connected to the port 228; three gate terminals 264 from the chip 214 are connected to the port 230; a single gate terminal 266 from the chip 214 along with two gate terminals 268 from the chip 216 are connected to the port 232; three gate terminals 270 from the chip 216 are connected to the port 234; and three gate terminals 272 from the chip 216 are connected to the port 236. Thus each of the 8 ports of the line 218 are connected to three cells.

In like manner, three drain (output) terminals from the chips are connected to each of the eight ports of the output line 220. From the above description, it may be seen that the configurations 150 and 210 of the present invention also accomplish the objective of connecting an odd number of chips to a binary tree in a manner which provides power divider/combiner functions in a symmetrical configuration which maintains equal phase and amplitude between the signal paths.

FIG. 9 is a top view of an assembly 300 showing the configuration 100 of FIG. 6 adapted for installation in a metal-ceramic hermetically sealed hybrid circuit package and illustrates the use of multiple bonding pads to facilitate the connections between the chips and the transmission lines.

Referring to FIGS. 6 and 9, the assembly 300 includes a metal mounting plate 302 having suitable cutouts for mounting hardware. Typical dimensions of the plate 302 are 0.95 inches (left to right) and 0.7 inches (top to bottom). A ceramic frame 304 is bonded to the plate 302 and forms a cavity 306 for the circuitry. Mounted within the cavity 306 are the three 12-cell chips 102,104 and 106. Mounted on the gate terminal side of the chips is a ceramic substrate 308 which supports the 4-port binary tree type input line 108 which is modified slightly in shape to more easily fit within the cavity 306.

Mounted on the drain terminal side of the chips is a ceramic substrate 310 which supports the 2-port binary type output line 110. Mounted between the substrate 308 and the chips are a series of three side-by-side substrates 312,314 and 316 each adjacent one of the chips 102,104 and 106. Each of the substrates 312-316 supports four metallized wirebonding pads 318. Each pad 318 has connected thereto three of the 12 gate terminals from the adjacent chip. Thus the four pads 318 on the substrate 312 are each connected to three gate terminals of the chip 102; the four pads 318 on the substrate 314 are each connected to three gate terminals of the chip 104; and the four pads 318 on the substrate 316 are each connected to three gate terminals of the chip 106.

The three leftmost pads 318 on the substrate 312 are connected to the port 112 of the line 108; the rightmost pad 318 on the substrate 312 and the two leftmost pads 318 on the substrate 314 are connected to the port 114; the two rightmost pads 318 on the substrate 314 and the leftmost pad 318 on the substrate 318 are connected to the port 116; and the three leftmost pads 318 on the substrate 316 are connected to the port 118 of the line 108. Comparing this configuration with that of FIG. 6, it may be seen that the same groups totaling nine gate terminals are connected to the corresponding ports of the input line 108 in both configurations.

The substrates 312-316 and pads 318 act to facilitate the wirebond connections between the chips and the line 108. Further, the electrical characteristics of the substrates 312-316 can be tailored to provide certain matching characteristics (e.g. resistive and capacitive) between the chips and the input port 120, which is connected to the elements 122 and 124 using suitable wirebonds. While three substrates 312-316 are shown in the embodiment of FIG. 9, a single substrate may also be used to perform the same wirebond connecting function.

In like manner, mounted between the substrate 310 and the chips are a a series of three side-by-side substrates 320,322 and 324 each adjacent one of the chips 102,104, and 106. Each of the substrates 320-324 supports 2 metallized wirebonding pads 326. Each pad 326 has connected thereto six of the 12 drain terminals from the adjacent chip. Thus the two pads 326 on the substrate 320 are each connected to six drain terminals of the chip 102; the two pads 326 on the substrate 322 are each connected to six drain terminals of the chip 104; and the two pads 326 on the substrate 324 are each connected to six drain terminals of the chip 106.

The two pads 326 on the substrate 320 along with the leftmost pad 326 on the substrate 322 are connected to the port 126 of the output line 110; and the rightmost pad 326 on the substrate 322 and the two pads 326 on the substrate 324 are connected to the port 128. Comparing this configuration with that of FIG. 6, it may be seen that the same groups totaling 18 drain terminals are connected to the corresponding ports of the output line 110 in both configurations.

The substrates 320-324 perform the same functions as the substrates 312-316, and may also take the form of a single substrate, and the output port 130 is connected to the elements 126 and 128 using suitable wirebonds. A variety of small metallized squares 328 are provided on the substrates 308 and 310 to tailor the electrical characteristics of the corresponding lines in a manner well know in the art. The assembly 300 is hermetically sealed using a suitable cover bonded to the top surface of the frame 304. Typical electrical characteristics of the assembly 300 connected as a power amplifier operating at 5 GHz include an output power level at 1 dB gain compression point of 42.35 dBm, power gain of 11.10 dB, and power added efficiency of 36.1% at a drain current of 4.4 amperes.

From the above description, it may be seen that the present invention provides divider/combiner circuits suitable for use with an odd number of multiple chips for assembly in small hybrid circuit packages in a cost efficient number. While the above examples showed the use of FET transistor chips, bipolar transistor chips may be used as well, where the input and output terminals correspond, for example, to base and collector junctions.

While preferred embodiments of the invention have been shown and described, it is to be understood that various other adaptations and modifications may be made within the spirit and scope of the invention. It is thus intended that the invention be limited in scope only by the appended claims.

What is claimed is:

1. A power divider/combiner circuit for connecting to a single port 2N+1 multi-cell monolithic transistor chips, each chip composed of an even number of cells, comprising:

transmission line means including a planar binary tree type transmission line structure having first and second ends for connecting $2^P$ transmission line ports at the first end to the single port at the second end, where N and P are each integers greater than or equal to 1; and connecting means for connecting an equal number of cells to each of the $2^P$ transmission line ports.

2. The circuit of claim 1 where P is chosen such that $$\frac{C}{2^P} = R$$

where R is an integer greater than 1, C is the sum total of the number of cells in the 2N+1 chips, and the connecting means connects R cells to each of the $2^P$ transmission line ports.

3. The circuit of claim 2 where some cells from at least one transistor chip are connected to a transmission line port which is different from the port to which other cells from that one chip are connected.

4. The circuit of claim 1 where the transistor chips are Field Effect transistor (FET) chips.

5. The circuit of claim 1 where the transistor chips are bipolar chips.

6. The circuit of claim 1 where each of the 2N+1 chips contains the same number of cells.

7. The circuit of claim 1 in which signals of a predetermined wavelength are provided thereto, and the width of the transmission line ports at the first end of the transmission line structure are less than half a wavelength.

8. A power divider/combiner circuit for connecting to single input and output ports 2N+1 multi-cell monolithic transistor chips, each composed of an even number of cells, where each cell includes a signal input and output terminal, comprising:

transmission line means including a first planar binary tree type transmission line structure having first and second ends for connecting $2^P$ transmission line ports at its first end to the single input port at its second end, and a second planar binary tree type transmission line structure having first and second ends for connecting $2^S$ transmission line ports at its first end to the single output port at its second end, where N, P and S are each integers greater than or equal to 1; and connecting means for connecting an equal number of input terminals to each of the $2^P$ transmission line ports, and for connecting an equal number of output terminals to each of the $2^S$ transmission line ports.

9. The circuit of claim 8 where P is chosen such that $$\frac{C}{2^P} = R$$

where R is an integer greater than 1, C is the sum total of the number of cells in the 2N+1 chips, and the connecting means connects R input terminals to each of the $2^P$ transmission line ports, and where S is chosen such that $$\frac{C}{2^S} = T$$

where T is an integer greater than 1, and the connecting means connects T output terminals to each of the $2^S$ transmission line ports.

10. The circuit of claim 9 where some input terminals from at least one transistor chip are connected to a transmission line port which is different from the port to which other input terminals from that chip are connected, and some output terminals from at least one transistor chip are connected to a transmission line port which is different from the port to which other output terminals are connected.

11. The circuit of claim 9 where the transistor chips are Field Effect transistor (FET) chips, the input terminals are gate terminals, and the output terminals are drain terminals.

12. The circuit of claim 9 where the transistor chips are bipolar chips, the input terminals are base terminals, and the output terminals are collector terminals.

13. The circuit of claim 8 where each of the 2N+1 chips contains the same number of cells.

14. The circuit of claim 8 in which signals of a predetermined wavelength are provided thereto, and the width of the transmission line ports at the first end of the transmission line structure are less than half a wavelength.

15. A method of connecting to a single port, 2N+1 multi-cell monolithic transistor chips, each chip composed of an even number of cells, comprising the steps of:

providing a planar binary tree type transmission line structure having first and second ends for connecting $2^P$ transmission line ports at the first end to the single port at the second end, where N and P are each integers greater than or equal to 1; and connecting an equal number of cells to each of the $2^P$ transmission line ports.

16. The method of claim 15 further including the step of selecting P such that $$\frac{C}{2^P} = R$$

where R is an integer greater than 1, and C is the sum total of the number of cells in the 2N+1 chips; and the step of connecting an equal number of cells includes connecting R cells to each of the $2^P$ transmission line ports.

17. The method of claim 16 where the step of connecting an equal number of cells includes connecting cells from at least one transistor chip to more than one of the $2^P$ transmission line ports.

18. The method of claim 15 where the transistor chips are Field Effect transistor (FET) chips.

19. The method of claim 15 where the transistor chips are bipolar chips.

20. The method of claim 15 where each of the 2N+1 chips contains the same number of cells.

21. The method of claim 15 further including providing to the transmission line structure signals of a predetermined wavelength, where the width of the transmission line ports at the first end of the transmission line structure are less than half a wavelength.

22. A method for connecting to single input and output ports, 2N+1 multi-cell monolithic transistor chips, each chip composed of an even number of cells, where each cell includes a signal input and output terminal, comprising:

providing a first planar binary tree type transmission line structure having first and second ends for connecting $2^P$ transmission line ports at its first end to the single input port at its second end;

providing a second planar binary tree type transmission line structure having first and second ends for connecting $2^S$ transmission line ports at its first end to the single output port at its second end, where N, P and S are each integers greater than or equal to 1; and connecting an equal number of input terminals to each of the $2^P$ transmission line ports; and connecting an equal number of output terminals to each of the $2^S$ transmission line ports.

23. The method of claim 22 further including the steps of:

selecting P such that $$\frac{C}{2^P} = R$$

where R is an integer greater than 1, and C is the sum total of the number of cells in the 2N+1 chips; selecting S such that $$\frac{C}{2^S} = T$$

where T is an integer greater than 1; and where the step of connecting the input terminals includes connecting R input terminals to each of the $2^P$ transmission line ports, and the step of connecting the output terminals includes connecting T output terminals to each of the $2^S$ transmission line ports.

24. The method of claim 23 where the step of connecting input terminals includes connecting input terminals from at least one transistor chip to more than one of the $2^P$ transmission line ports; and the step of connecting output terminals includes connecting output terminals from at least one transistor chip to more than one of the $2^S$ transmission line ports.

25. The method of claim 23 where the transistor chips are Field Effect transistor (FET) chips, the input terminals are gate terminals, and the output terminals are drain terminals.

26. The method of claim 23 where the transistor chips are bipolar chips, the input terminals are base terminals, and the output terminals are collector terminals.

27. The method of claim 22 where each of the 2N+1 chips contains the same number of cells.

28. The method of claim 22 further including providing to the transmission line structure signals of a predetermined wavelength, where the width of the transmission line ports at the first end of the transmission line structure are less than half a wavelength.

* * * * *

UNITED STATES PATENT AND TRADEMARK OFFICE
CERTIFICATE OF CORRECTION

PATENT NO. : 5,132,641
DATED : July 21, 1991
INVENTOR(S) : Chandra Khandavalli

It is certified that error appears in the above-identified patent and that said Letters Patent is hereby corrected as shown below:

On the Front Page:

Abstract, line 10, after "ports" insert a period.

Column 1, line 41, after "Such" insert -- packages place severe size limitations on the circuit --.

Column 4, line 57, after "is" delete the comma.
Column 4, line 59, change "ex-ample" to -- example --.

Column 5, line 40, after "using" change "L" to -- a --.
Column 5, lines 56,57, delete the extra spaces between the two lines.
Column 5, line 61, change "wirebond" to -- wirebonds --.

Column 6, line 1, after "1" delete the parentheses (second occurrence).
Column 6, line 3, change "t.han" to -- than --.
Column 6, line 4, change "aa" to -- a --.
Column 6, line 34, after "cells" insert a period.
Column 6, line 41, after "clarity" insert a closing parentheses.
Column 6, line 57, after "106" delete "are connected".

Column 7, line 39, change "158,160" to -- 152,160 --.
Column 7, line 45, change "78,180" to -- 178,180 --.

Column 8, line 1, after "ports" delete "port".
Column 8, line 9, change "lides" to -- lines --.

UNITED STATES PATENT AND TRADEMARK OFFICE
CERTIFICATE OF CORRECTION

PATENT NO. : 5,132,641

DATED : July 21, 1991

INVENTOR(S) : Chandra Khandavalli

It is certified that error appears in the above-identified patent and that said Letters Patent is hereby corrected as shown below:

Column 8, line 67, change "312.314" to -- 312,314 --.

Column 9, line 34, before "series" delete "a".
Column 9, line 61, change "know" to -- known --.

Signed and Sealed this

Twenty-fifth Day of January, 1994

Attest:

BRUCE LEHMAN

Attesting Officer

Commissioner of Patents and Trademarks